United States Patent [19]
Konno et al.

[11] Patent Number: 5,178,315
[45] Date of Patent: Jan. 12, 1993

[54] SOLDERING DEVICE FOR ELECTRONIC ELEMENTS

[75] Inventors: Masahiko Konno; Yuji Kita, both of Saitama, Japan

[73] Assignee: Pioneer Electronic Corporation, Tokyo, Japan

[21] Appl. No.: 829,636

[22] Filed: Feb. 3, 1992

[30] Foreign Application Priority Data

Jun. 6, 1991 [JP] Japan ................... 3-162023

[51] Int. Cl.⁵ .................. B23K 3/00; B23K 37/04
[52] U.S. Cl. ................... 228/44.7; 228/212; 269/903
[58] Field of Search ............ 228/6.2, 44.7, 212, 228/213, 180.2; 269/903

[56] References Cited

U.S. PATENT DOCUMENTS

| | | | |
|---|---|---|---|
| 3,442,432 | 5/1969 | Santangini | 228/44.7 |
| 3,887,996 | 6/1975 | Hartleroad et al. | 228/180.2 |
| 3,998,377 | 12/1976 | Metz | 228/180.2 |

FOREIGN PATENT DOCUMENTS 1214353  2/1986  U.S.S.R. ................. 228/44.7

Primary Examiner—Samuel M. Heinrich
Attorney, Agent, or Firm—Nikaido, Marmelstein, Murray & Oram

[57] ABSTRACT

A device for soldering an electronic element to a substrate has a support head for supporting the substrate, and a pusher having a push head provided above the support head for pushing the electronic element to the substrate. The holder is upwardly moved to push the element to the substrate.

4 Claims, 3 Drawing Sheets

SOLDERING DEVICE FOR ELECTRONIC ELEMENTS

BACKGROUND OF THE INVENTION

The present invention relates to a device for soldering a small electronic element such as an IC chip to a substrate, for preventing the electronic element from becoming defective.

Recently, soldering using a light beam is used for soldering an electronic element because the size of the element becomes small. Terminals of an electronic element such as IC chip is connected to terminals formed on a substrate by a solder with a light beam.

FIG. 1 shows a conventional soldering method. An electronic element 3 is mounted on a substrate sheet 1 so as to position terminals formed on the underside of the electronic element 3 to wiring patterns formed on the substrate sheet 1. A push rod 4 is lowered to be abutted on the surface of the electronic element 3, thereby ensuring the positioning of the element 3 to the substrate 1. Then, solder 2 is deposited on the periphery of the element 3 and a beam 5 is projected on the solder 2. The solder 2 is melt and charged into the joint between the element 3 and the substrate 1. Thus, the terminals and wiring patterns are electrically connected to each other.

In accordance with the soldering, it is possible to solder the element to the substrate at a small hot spot. However, since the hot spot is very small, the heating is locally concentrated to raise the temperature at the connecting portion, causing thermal stress in the connecting portion due to thermal expansion.

Accordingly, when the solder 2 is solidified, a deformation 6 is formed on the substrate 1 as shown in FIG. 2. In the deformation 6, tension stress is produced in the joint to break the electrical connection between the substrate 1 and the electronic element 3 or the solder 2 is cracked to increase the resistance, causing bad electrical connection.

Even if these defects are not produced, such a deformation 6 causes a trouble in an automatic assembling process there-after. It is necessary to correct the deformation 6 to be flat. If a force is applied to the deformation 6 to flatten the substrate 1, the substrate 1 and the solder 2 are subjected to the force, causing the electrical connection to break and cracking the substrate 1.

The other soldering methods using heating flux also have these problems.

SUMMARY OF THE INVENTION

An object of the present invention is to provide a soldering device where thermal deformation of the substrate is prevented, thereby providing a good electrical connection there-between.

According to the present invention, a device for soldering an electronic element to a substrate, comprising a supporting device having a holder and a support head mounted on the holder for supporting the substrate, a pusher having a push head provided above the support head for pushing the electronic element to the substrate, first driving means for vertically moving the holder, and second driving means for vertically moving the push head.

In an aspect of the invention, the support head is vertically movably provided and supported by a spring.

The other objects and features of this invention will become understood from the following description with reference to the accompanying drawings.

DETAILED DESCRIPTION OF THE PREFERRED EMBODIMENTS

Figure 1:
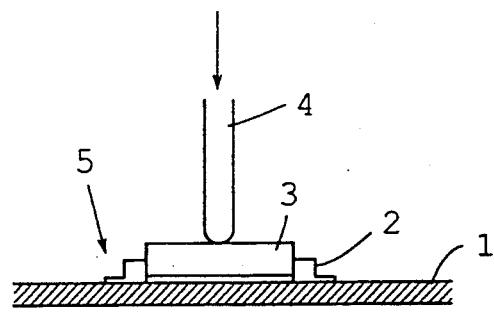
FIG. 1 is a schematic sectional side view showing a conventional soldering method.
Figure 2:
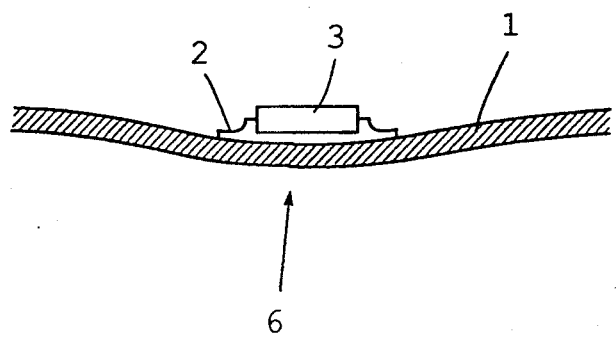
FIG. 2 is a schematic sectional side view explanatory showing the result of the soldering of FIG. 1.
Figure 3:
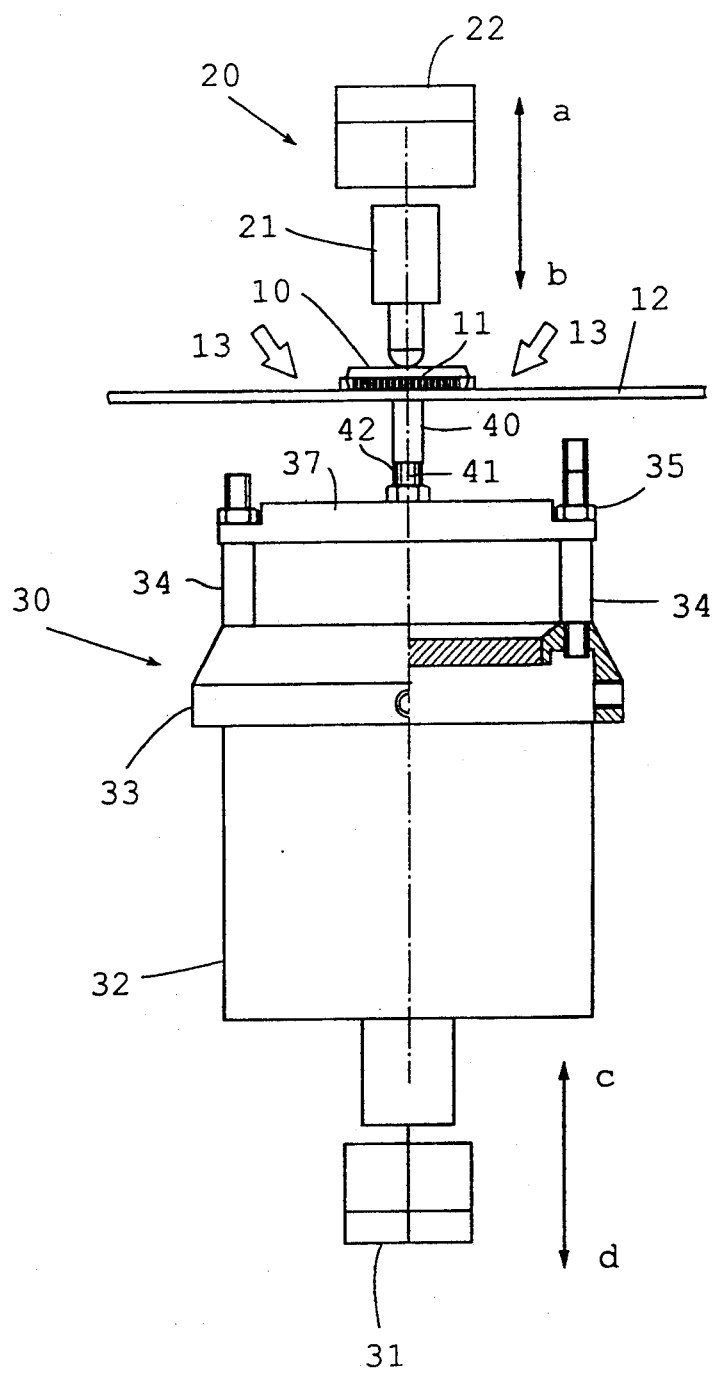
FIG. 3 is a front view showing a soldering device according to the present invention, partly shown in section.

Referring to FIG. 3 showing a soldering device for the electronic element to which the present invention is applied, a supporting device 30 is provided under a substrate 12 for supporting the substrate at the soldering position. The supporting device 30 is disposed corresponding to a pusher 20 which is provided on a upper the substrate 12. The substrate 12 has wiring patterns (not shown) on which terminals 11 of an electronic element 10 is positioned.

The pusher 20 comprises a push head 21 provided with a push rod having an arc end, and a pneumatic cylinder 22 for operating the push head 21. The push head 21 is moved in the vertical direction shown by arrows a and b by the cylinder 22.

When the substrate 12 is not fed between the push head 21 and the supporting device 30, the pusher 20 is raised in the direction a to a rest position.

The supporting device 30 comprises a movable bed 32, and a table 33 detachably mounted on the bed 32. A hydraulic cylinder 31 is provided for operating the table 33. The table 33 is moved in the vertical direction shown by arrows c and d by the cylinder 31. A pair of pins 34 are mounted on the table 33 opposite to each other, to which a lateral holder 37 is secured with bolts 35. A support head 40 is mounted on the holder 37 at the central portion thereof and provided corresponding to the push rod of the push head 21. The support head 40 is slidably mounted on a rod 41 secured to the holder 37 with a bolt. A spring 42 is provided between the head 40 and the bolt to urge the head in the upward direction. Furthermore, if the cylinder 31 operates to raise the table 33 in the direction c, the head 40 is moved in the upward direction.

Figure 4:
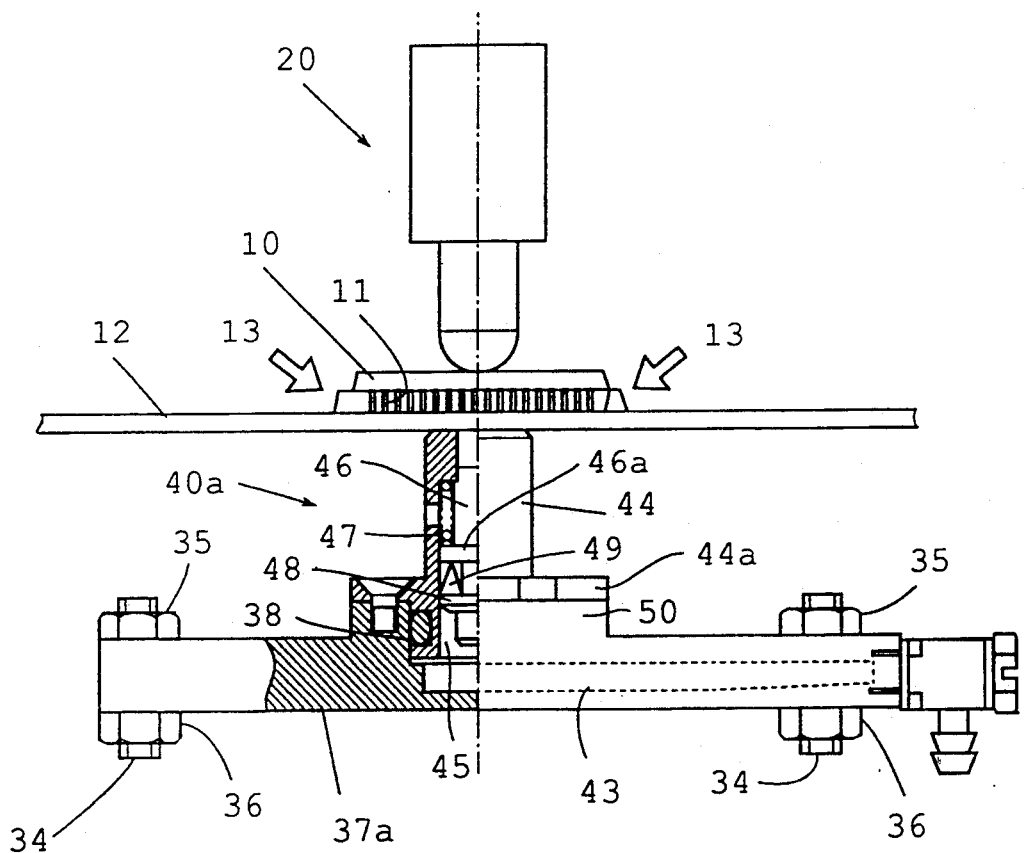
FIG. 4 is a front view showing a main part of a soldering device of another embodiment, partly shown in section.

Referring to FIG. 4 showing another embodiment of the supporting device, a lateral holder 37a is mounted on the pins 34 with a pair of upper and lower bolts 35 and 36. Thus, the position of the holder 37a is vertically adjustable on the pins 34.

The lateral holder 37a has a supporting portion 50 formed at the central portion thereof, a recess 45 therein, and a passage 43 axially formed therein to be communicated with an air supply source (not shown) for passing pressurized air therethrough. The passage 43 communicates with the recess 45 which serves as an air chamber.

A support head 40a comprises a cylindrical casing 44 having a flange portion 44a. The lower portion of the casing 44 is engaged with the recess 45 of the holder 37a, while the flange portion 44a is secured to the supporting portion 50 with rivets.

In the casing 44, a piston rod 46 is slidably mounted through the casing. The piston rod 46 has a flange 46a, and a diaphragm 48 formed on the lower portion of the flange 46a. The flange 46a and the diaphragm 48 are slidably engaged with the inner wall of the casing 44. A spring 47 is provided between the flange 46a and a shoulder portion formed on the inside wall of the casing 44 to urge the piston rod 46 in the downward direction. The lower end of the piston rod 46 extends in the chamber 45 so that the air chamber 45 is defined by the diaphragm 48. The pressurized air supplied to the chamber 45 is applied to the diaphragm 48. An O-ring 38 is provided in a recess formed on the outer periphery of the lower portion of the casing 44 so as to make the chamber 45 air-tight. A resilient lining 49 is provided between the flange 46a and the diaphragm 48 for preventing the air from leaking from the chamber 45.

Figure 5:
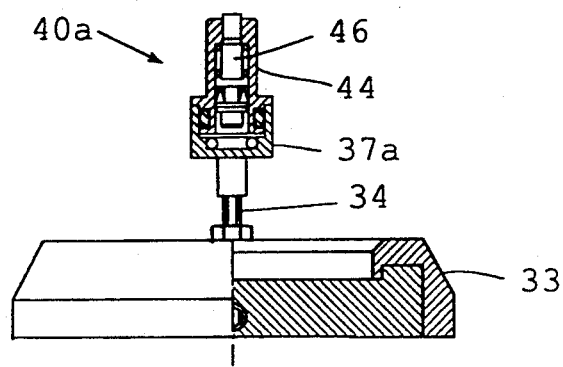
FIG. 5 is a sectional side view showing a further embodiment of the present invention.

In the embodiment of FIG. 5, the lateral holder 37a is secured to the table 33 in the first embodiment of FIG. 3.

Describing a supporting operation during the soldering, the substrate 12 is disposed between the pusher 20 and the supporting device 30. Before soldering, the electronic element 10 is mounted on the wiring patterns formed on the substrate 12 and the substrate 12 provided with the electronic element 10 is fed to the soldering position. At the soldering position, the push rod 21 is lowered by operating the cylinder 22 to push the electronic element 10 to the substrate 12. On the other hand, the cylinder 31 is operated to raise the bed 32 to abut the support head 40 on the underside of the substrate 12 opposite to the element 10. Thus, the substrate 12 having the electronic element 10 is supported by the push rod 21 and the support head 40 at opposite sides.

In this state, the solder is deposited to the joint between the wiring patterns and the terminals 11 and the light beams 13 are applied to the solder. In the present invention, during the soldering, the push head 21 and the support head 40 restrain the substrate 12 from the thermal deformation.

In a supporting operation of the supporting device shown in FIG. 4, the pressurized air is supplied to the air chamber 45 of the holder 37a through the passage 43 so that the diaphragm 48 is pushed to urge the piston rod 46 in the upward direction. Thus, the upper end of the piston rod 46 is projected from the casing 44 to be abutted on the underside of the substrate 12.

In the present invention, the supporting device can be provided with a system for moving the bed in X-Y axis directions in synchronism with the pusher.

In accordance with the present invention, during the soldering, the substrate is supported together with the electronic element by the push rod and the support head which are provided opposite to each other. Thus, the soldering is performed in the flat state of the substrate. After soldering, the substrate is fed to the assembling process with maintaining a good electrical connection between the wiring patterns and terminals.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A device for soldering an electronic element to a substrate, comprising:
   a supporting device having a holder and a support head mounted on the holder for supporting the substrate;
   a pusher having a push head provided above the support head, a lower end of said push head having an area to be abutted on a central portion of said electronic element, said push head for pushing the electronic element to the substrate;
   first driving means for vertically moving the holder; and
   second driving means for vertically moving the push head wherein said electronic element and said substrate are gripped by said support head and said push head which is abutted on said central portion of said electronic element.

2. A device according to claim 1 wherein the support head is vertically movably provided and supported by a spring.

3. A device according to claim 1 wherein the first and second driving means are fluid operated cylinders, respectively.

4. A device according to claim 1 wherein the support head has a top surface having a smaller area than that of the electronic element.

* * * * *